(12) United States Patent
Dueweke et al.

(10) Patent No.: US 9,556,019 B2
(45) Date of Patent: Jan. 31, 2017

(54) CAVITY PRESSURE MODIFICATION USING LOCAL HEATING WITH A LASER

(71) Applicant: InvenSense, Inc., San Jose, CA (US)

(72) Inventors: Michael Dueweke, Campbell, CA (US); Martin Lim, San Mateo, CA (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 14/705,630

(22) Filed: May 6, 2015

(65) Prior Publication Data

US 2016/0325985 A1   Nov. 10, 2016

(51) Int. Cl.
  *H01L 29/84*   (2006.01)
  *B81C 1/00*   (2006.01)
  *B81B 7/00*   (2006.01)

(52) U.S. Cl.
  CPC ......... *B81C 1/00293* (2013.01); *B81B 7/0038* (2013.01)

(58) Field of Classification Search
  CPC .............. B81C 1/00293; B81C 2201/019; B81B 7/0038; B81B 2201/042; B81B 2201/058; H01L 2924/1461; H01L 2924/12042
  See application file for complete search history.

(56) References Cited

U.S. PATENT DOCUMENTS

| | | | | |
|---|---|---|---|---|
| 2005/0074919 A1* | 4/2005 | Patel | ..................... | B81B 7/0077 438/107 |
| 2006/0134825 A1* | 6/2006 | DCamp | ................. | B81B 7/0038 438/106 |
| 2007/0266784 A1* | 11/2007 | Lust | ........................ | G01C 19/62 73/504.05 |
| 2008/0211073 A1* | 9/2008 | Hatakeyama | ........... | H01L 23/04 257/678 |
| 2011/0027941 A1* | 2/2011 | Kumar | ................ | B81C 1/00246 438/106 |
| 2012/0220101 A1* | 8/2012 | Teggatz | ................ | H01L 21/187 438/455 |
| 2012/0307211 A1* | 12/2012 | Hofmann | ............. | G02B 26/101 353/31 |
| 2012/0326248 A1* | 12/2012 | Daneman | .................. | B81B 7/02 257/415 |
| 2012/0328779 A1* | 12/2012 | Caplet | ................... | B81B 7/0038 427/245 |

* cited by examiner

*Primary Examiner* — Yosef Gebreyesus
(74) *Attorney, Agent, or Firm* — Amin, Turocy & Watson, LLP (57) ABSTRACT

A method and system for changing a pressure within at least one enclosure in a MEMS device are disclosed. In a first aspect, the method comprises applying a laser through one of the at least two substrates onto a material which changes the pressure within at least one enclosure when exposed to the laser, wherein the at least one enclosure is formed by the at least two substrates. In a second aspect, the system comprises a MEMS device that includes a first substrate, a second substrate bonded to the first substrate, wherein at least one enclosure is located between the first and the second substrates, a metal layer within one of the first substrate and the second substrate, and a material vertically oriented over the metal layer, wherein when the material is heated the material changes a pressure within the at least one enclosure.

19 Claims, 6 Drawing Sheets

CAVITY PRESSURE MODIFICATION USING LOCAL HEATING WITH A LASER

FIELD OF THE INVENTION

The present invention relates to microelectromechanical system (MEMS) sensors, and more particularly, to modifying cavity pressure of a MEMS sensor by using localized heating.

BACKGROUND

Microelectromechanical system (MEMS) sensors can have different cavities within the same cap and substrate. Conventional MEMS sensors require additional time consuming and costly manufacturing steps to create cavities at varying pressures. In addition, conventional MEMS sensors do not enable adjustment of the cavity pressure after it has been sealed. Therefore, there is a strong need for a solution that overcomes the aforementioned issues. The present invention addresses such a need.

SUMMARY OF THE INVENTION

A method and system for changing a pressure within at least one enclosure in a MEMS device are disclosed. In a first aspect, the method comprises applying a laser through one of the at least two substrates onto a material which changes the pressure within at least one enclosure when exposed to the laser, wherein the at least one enclosure is formed by the at least two substrates.

In a second aspect, the system comprises a MEMS device that includes a first substrate, a second substrate bonded to the first substrate, wherein at least one enclosure is located between the first and the second substrates, a metal layer within one of the first substrate and the second substrate, and a material vertically oriented over the metal layer, wherein when the material is heated the material changes a pressure within the at least one enclosure.

BRIEF DESCRIPTION OF THE DRAWINGS

The accompanying figures illustrate several embodiments of the invention and, together with the description, serve to explain the principles of the invention. One of ordinary skill in the art readily recognizes that the embodiments illustrated in the figures are merely exemplary, and are not intended to limit the scope of the present invention.

DETAILED DESCRIPTION

The present invention relates to microelectromechanical system (MEMS) sensors, and more particularly, to modifying cavity pressure of a MEMS sensor by using localized heating. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiments shown but is to be accorded the widest scope consistent with the principles and features described herein.

Micro-Electro-Mechanical Systems (MEMS) refers to a class of devices fabricated using semiconductor-like processes and exhibiting mechanical characteristics such as the ability to move or deform. MEMS often, but not always, interact with electrical signals. A MEMS device may refer to a semiconductor device implemented as a microelectromechanical system. A MEMS device includes mechanical elements and optionally includes electronics for sensing. MEMS devices include but are not limited to gyroscopes, accelerometers, magnetometers, and pressure sensors.

In MEMS devices, a port is an opening through a substrate to expose MEMS structure to the surrounding environment. A chip includes at least one substrate typically formed from a semiconductor material. A single chip may be formed from multiple substrates, wherein the substrates are mechanically bonded to preserve functionality. Multiple chips include at least two substrates, wherein the at least two substrates are electrically connected but do not require mechanical bonding.

Typically, multiple chips are formed by dicing wafers. MEMS wafers are silicon wafers that contain MEMS structures. MEMS structures may refer to any feature that may be part of a larger MEMS device. One or more MEMS features comprising moveable elements is a MEMS structure. MEMS features may refer to elements formed by a MEMS fabrication process such as bump stop, damping hole, via, port, plate, proof mass, standoff, spring, and seal ring.

MEMS substrates provide mechanical support for the MEMS structure. The MEMS structural layer is attached to the MEMS substrate. The MEMS substrate is also referred to as handle substrate or handle wafer. In some embodiments, the handle substrate serves as a cap to the MEMS structure. Bonding may refer to methods of attaching and the MEMS substrate and an integrated circuit (IC) substrate may be bonded using a eutectic bond (e.g., AlGe, CuSn, AuSi), fusion bond, compression, thermocompression, adhesive bond (e.g., glue, solder, anodic bonding, glass frit). An IC substrate may refer to a silicon substrate with electrical circuits, typically CMOS circuits. A package provides electrical connection between bond pads on the chip to a metal lead that can be soldered to a printed board circuit (PCB). A package typically comprises a substrate and a cover.

An enclosure or sealed cavity may refer to a fully enclosed volume typically surrounding the MEMS structure and typically formed by the IC substrate, structural layer, MEMS substrate, and the standoff seal ring.

A method and system in accordance with the present invention enables pressure reduction within at least one enclosure of a MEMS device by locally heating and activating a material within the at least one enclosure at a higher temperature than feasible for the entire MEMS device. In one embodiment, the material is heated by applying a laser through one of at least two substrates that form the at least one enclosure and onto the material which changes the pressure within the at least one enclosure when the material is exposed to the heat produced by the laser. The method and system reduces the manufacturing and process steps required to create cavities with differing pressures, reduces costs, and provides better control of the desired cavity pressure of MEMS devices.

In one embodiment, the method and system provide for changing a pressure within at least one enclosure of a device. The pressure can be increased or decreased within a given cavity after the cavity has been sealed. Therefore, different cavities within the same cap and substrate of the device (e.g., a MEMS cap and MEMS substrate of a MEMS device) can have different pressures even though they were previously sealed with the same process and the same pressure.

For example, a MEMS device that is manufactured with three sealed cavities with the same pressure can be modified using a method in accordance with the present invention to have a first cavity with a first pressure (the original pressure), a second cavity with a second pressure, and a third cavity with a third pressure, wherein the second pressure is lower than the first pressure and the third pressure is higher than the first pressure. The method provides a simpler process for multiple cavities with different pressures by reducing process steps.

By initially manufacturing/creating a device with a plurality of cavities that all have the same pressure, and then changing the pressure of at least a portion of the plurality of cavities after the plurality of cavities have been sealed using a method in accordance with the present invention, the complexity, time, and costs associated with the device manufacturing process steps are reduced. Referring back to the example above, if the device was originally created with three cavities that each have different pressures before the cavities are sealed, the associated manufacturing time and costs would be greater than if the device was originally created with three cavities of similar pressures and then pressures are changed after the cavities have been sealed.

In one embodiment, the method in accordance with the present invention provides for local heating and outgassing for different cavities within the same substrate. This is advantageous for inertial sensors where gyroscopes operating a low pressure are contained within an enclosure of a substrate and accelerometers operating at a higher pressure are contained in another enclosure within the same substrate. One of ordinary skill in the art readily recognizes that other MEMS device arrangements require differing pressures within the same substrates and that would be within the spirit and scope of the present invention.

The method and system in accordance with the present invention provide for local pressure adjustment with each cavity of a device by locally heating a material (e.g., outgassing material, gettering/getter material) within each cavity. The outgassing material outgasses (releases gas) when heated and the gettering material absorbs gas when heated. Therefore, in one embodiment, to increase the pressure within an enclosure, the laser light/heat is applied to the outgassing material (by releasing gases into the cavity, the pressure is increased) and to decrease the pressure within an enclosure, the laser light/heat is applied to the gettering material (by absorbing gases from the cavity, the pressure is decreased).

In addition to using a laser/light to heat the material, other heating methods that change the pressure while being localized and providing similar levels of adjustment can be utilized. In one embodiment, the laser is an infrared (IR) laser.

To describe the features of the present invention in more detail, refer now to the following description in conjunction with the accompanying Figures.

Figure 1:
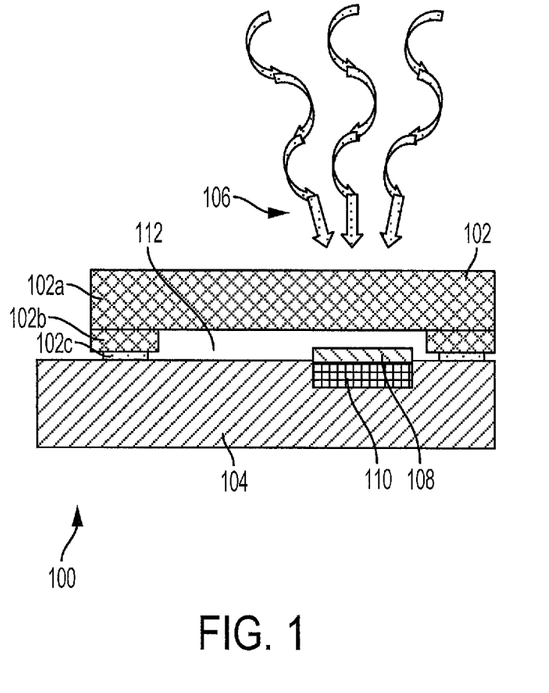
FIG. 1 illustrates a cross-section view of a device in accordance with an embodiment.

FIG. 1 illustrates a cross-section view of a device 100 in accordance with an embodiment. The device 100 includes a cap 102 and a substrate 104 bonded or coupled to the cap 102. In the device 100, an enclosure 112 is formed between the cap 102 and the substrate 104. In one embodiment, the enclosure 112 is formed with a desired gas and at a desired pressure by any of wafer fusion bonding, eutectic bonding, thermal compression bonding, epoxy, and other bonding methods. In one embodiment, the cap 102 (cap wafer) includes a MEMS device within the enclosure 112 and the substrate 104 is a complementary metal-oxide-semiconductor (CMOS) substrate (CMOS circuit wafer).

In one embodiment, the cap 102 comprises a handle wafer 102a, a MEMS device wafer 102b, and a seal ring 102c which interfaces with the substrate 104. In another embodiment, the cap 102 comprises a different set of parts. The enclosure 112 contains a material 108 which changes the pressure within the enclosure 112 when heated (e.g., heated using a laser). In one embodiment, the material 108 is deposited on a layer 110 that is integrated within or into the substrate 104.

In one embodiment, the material 108 is an outgassing material which outgasses when heated thereby increasing the pressure within the enclosure 112. In another embodiment, the material 108 is a gettering material which absorbs gas when heated thereby decreasing the pressure within the enclosure 112. In another embodiment, the material 108 comprises both an outgassing material portion and a gettering material portion so that when either portion of the material 108 is heated, the cavity pressure can be changed accordingly (based upon which portion is heated). In one embodiment, the outgassing material is a silicon oxide including but not limited to tetraethyl orthosilicate (TEOS) or high density plasma (HDP) deposited silicon dioxide.

In FIG. 1, a method for changing the pressure within the enclosure 112 can include applying and focusing a laser light 106 through the cap 102 and onto the material 108. In one embodiment, the laser light 106 has an infrared (IR) wavelength that enables it to partially or substantially pass through the cap 102. In one embodiment, the material 108 is deposited on the layer 110 that comprises a metal layer so that the layer 110 partially reflects the incident laser light from the applied laser light 106 back onto the material 108 (further heating the material 108).

If the material 108 is an outgassing material, the laser light 106 that is focused on the material 108 and the reflections from the laser light 106 that are reflected by the layer 110 and back onto the material 108 increase the energy within the outgassing material. Once the energy within the outgassing material is increased and the temperature of the outgassing material increases sufficiently, the outgassing material releases gases, increasing the pressure within the enclosure 112. In another embodiment, the material 108 is a gettering material which decreases the enclosure 112 pressure when heated by the laser light 106.

Figure 2:
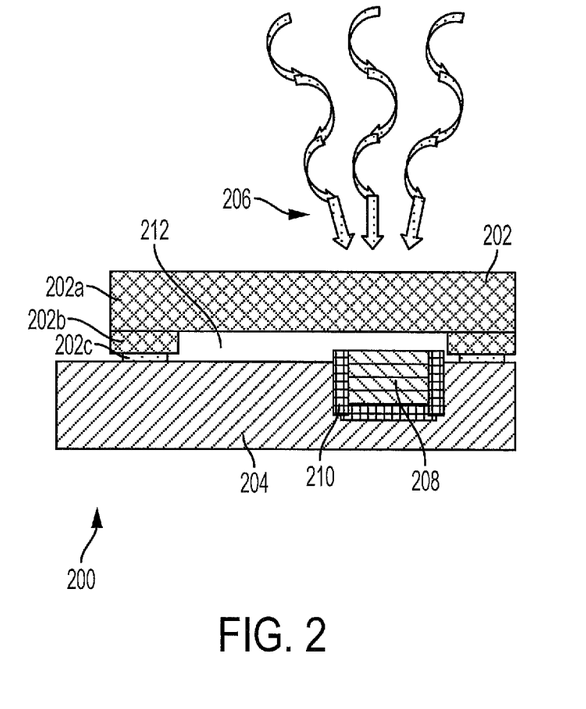
FIG. 2 illustrates a cross-section view of a device in accordance with an embodiment.

FIG. 2 illustrates a cross-section view of a device 200 in accordance with an embodiment. The device 200 includes a cap 202 and a substrate 204 bonded or coupled to the cap 202. In the device 200, an enclosure 212 is formed between the cap 202 and the substrate 204. In one embodiment, the enclosure 212 is formed with a desired gas and at a desired pressure by any of wafer fusion bonding, eutectic bonding, thermal compression bonding, epoxy, and other bonding methods. In one embodiment, the cap 202 (cap wafer) includes a MEMS device within the enclosure 212 and the substrate 204 is a complementary metal-oxide-semiconductor (CMOS) substrate (CMOS circuit wafer).

In one embodiment, the cap 202 comprises a handle wafer 202a, a MEMS device wafer 202b, and a seal ring 202c which interfaces with the substrate 204. In another embodiment, the cap 202 comprises a different set of parts. The enclosure 212 contains a material reservoir 208 which changes the pressure within the enclosure 212 when heated (e.g., heated using a laser). The material reservoir 208 comprises additional material in comparison to the material 108 of the device 100 in FIG. 1 and this enables the device 200 to more readily change the pressure within the enclosure 212. In one embodiment, the material reservoir 208 is deposited within a metal trough 210 that is integrated within or into the substrate 204. The metal trough 210 reflects the incident laser light 206 that is applied to the material reservoir 208 to further heat up the material reservoir 208 thereby further changing the pressure within the enclosure 212.

In one embodiment, the metal trough 210 is not connected to other circuitry in order to thermally isolate the area around the metal trough 210 from surrounding devices and MEMS structures. In another embodiment, the metal trough 210 is connected to an electrical ground to dissipate the heat that is generated when the laser light 206 is applied through the enclosure 212 and onto the material reservoir 208. The device 200 provides for a greater concentration of laser energy and heat by increasing the number of reflections that occur through the material reservoir 208.

If the material reservoir 208 is an outgassing material, the laser light 206 that is focused on the material reservoir 208 and the reflections from the laser light 206 that are reflected by the metal trough 210 and back onto the material reservoir 208 increase the energy within the outgassing material. Once the energy within the outgassing material is increased and the temperature of the outgassing material increases sufficiently, the outgassing material releases gases thereby increasing the pressure within the enclosure 212.

In another embodiment, the material reservoir 208 is a gettering material which decreases the enclosure 212 pressure when heated by the laser light 206. The metal trough 210 helps to reflect incident laser light and heat up the gettering material of the material reservoir 208 which absorbs gases within the enclosure 212 thereby decreasing the pressure within the enclosure 212. In another embodiment, an enclosure contains both an outgassing material and a gettering material deposited in different areas within the same enclosure.

Figure 3:
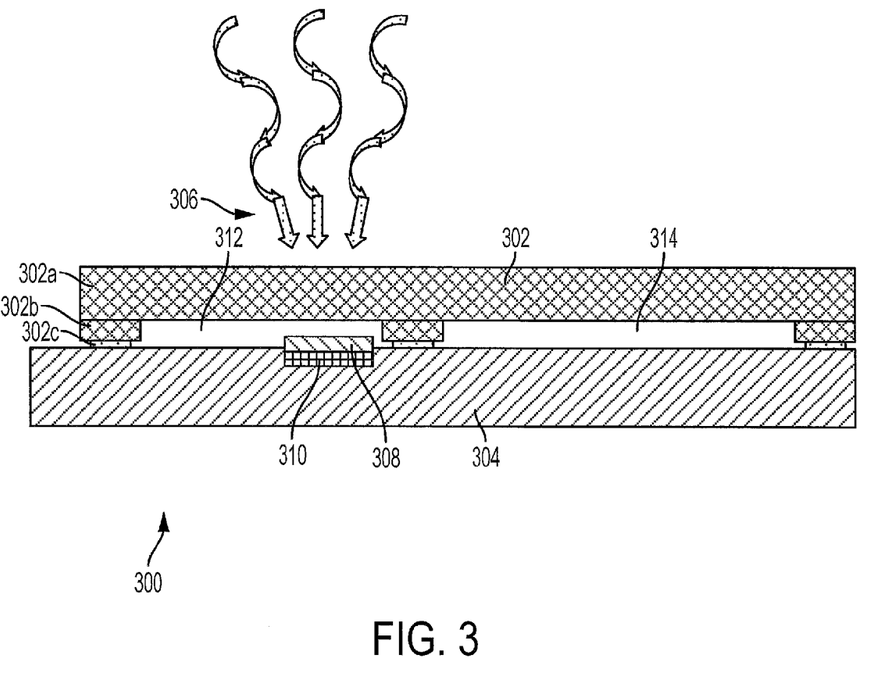
FIG. 3 illustrates a cross-section view of a device in accordance with an embodiment.

FIG. 3 illustrates a cross-section view of a device 300 in accordance with an embodiment. The device 300 includes a cap 302 and a substrate 304 bonded or coupled to the cap 302. In the device 300, a first enclosure 312 and a second enclosure 314 are formed between the cap 302 and the substrate 304. In another embodiment, more than two sealed cavities or enclosures are formed in the device 300. In one embodiment, each of the first and the second enclosures 312 and 314 are formed with a desired gas and at a desired pressure by any of wafer fusion bonding, eutectic bonding, thermal compression bonding, epoxy, and other bonding methods. In one embodiment, the cap 302 (cap wafer) includes a MEMS device within either or both of the first and the second enclosures 312 and 314 and the substrate 304 is a complementary metal-oxide-semiconductor (CMOS) substrate (CMOS circuit wafer).

In one embodiment, the cap 302 comprises a handle wafer 302a, a MEMS device wafer 302b, and a seal ring 302c which interfaces with the substrate 304. In another embodiment, the cap 302 comprises a different set of parts. In one embodiment, the first enclosure 312 contains a material 308 which changes the pressure within the enclosure 312 when heated (e.g., heated using a laser). In another embodiment, the second enclosure 314 contains the material 308. In another embodiment, both the first and the second enclosures 312 and 314 contain the material 308 in two separate portions. In another embodiment, an enclosure contains both an outgassing material and a gettering material deposited in different areas within the same enclosure. In one embodiment, the material 308 is deposited on a layer 310 that is integrated within or into the substrate 304.

In the device 300, the first and the second enclosures 312 and 314 are sealed at the same time and under the same process conditions. After sealing, the enclosure or cavity pressure can be selectively altered within each of the first and the second enclosures 312 and 314 by applying varying amounts of a laser light 306 (or another heat producing mechanism). In one embodiment, and as aforementioned, once the laser light 306 is applied to the material 308, and the layer 310 (metal layer) reflects the laser light and heat back to the material 308, the material 308 will heat up.

If the material 308 is an outgassing material then the heating up will result in outgassing (releasing of gases) into the first enclosure 312 thereby increasing the pressure within the first enclosure 312. If the material 308 is a gettering material then the heating up will result in absorption of gases from the first enclosure 312 thereby decreasing the pressure within the first enclosure 312.

In FIG. 3, the second enclosure does not include a material and therefore the laser light 306 is not applied through the cap 302 and into the second enclosure 314. As a result, only the pressure of the first enclosure 312 will increase (or decrease) and the pressure of the second enclosure 314 will be the same pressure as originally sealed. If the pressure of the first enclosure 312 is increased (because the material 308 is outgassing) then the pressure of the second enclosure 314 would be lower than the pressure of the first enclosure 312. If the pressure of the first enclosure 312 is decreased (because the material 308 is a getter material) then the pressure of the second enclosure 314 would be higher than the pressure of the first enclosure 312.

The device 300 is optimal for MEMS devices with a cap 302 and a substrate 304 that contain different MEMS elements that function best at different pressures. For example, with inertial sensors it is beneficial to have a lower pressure the MEMS gyroscope operation but it is beneficial to have a higher pressure for the MEMS accelerometer operation. The method in accordance with the present invention enables precise and customizable tuning of the pressures within each enclosure to individually optimize performance for one MEMS element in a first cavity (e.g., accelerometer in the first enclosure 312 that requires a higher pressure) and for another MEMS element in a second cavity (e.g., gyroscope in the second enclosure 314 that requires a lower pressure so the originally sealed pressure is maintained).

Figure 4:
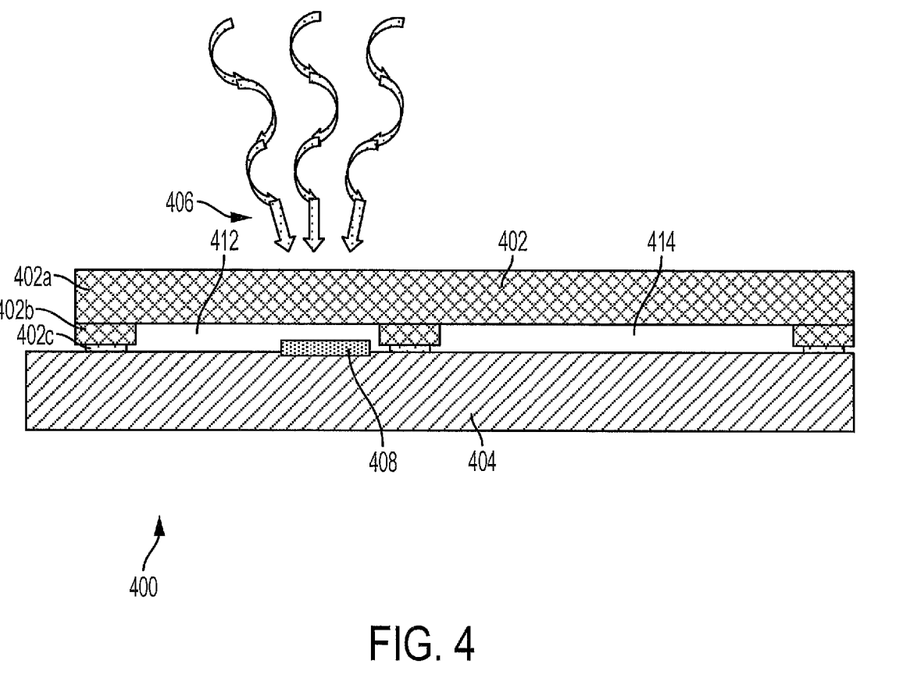
FIG. 4 illustrates a cross-section view of a device in accordance with an embodiment.

FIG. 4 illustrates a cross-section view of a device 400 in accordance with an embodiment. The device 400 includes a cap 402 and a substrate 404 bonded or coupled to the cap 402. In the device 400, a first enclosure 412 and a second enclosure 414 are formed between the cap 402 and the substrate 404. In another embodiment, more than two sealed cavities are formed in the device 400. In one embodiment, each of the first and the second sealed cavities 412 and 414 are formed with a desired gas and at a desired pressure by any of wafer fusion bonding, eutectic bonding, thermal compression bonding, epoxy, and other bonding methods. In one embodiment, the cap 402 (cap wafer) includes a MEMS device within either or both of the first and the second sealed cavities 412 and 414 and the substrate 404 is a complementary metal-oxide-semiconductor (CMOS) substrate (CMOS circuit wafer).

In one embodiment, the cap 402 comprises a handle wafer 402a, a MEMS device wafer 402b, and a seal ring 402c which interfaces with the substrate 404. In another embodiment, the cap 402 comprises a different set of parts. In one embodiment, the first enclosure 412 contains a material 408 which changes the pressure within the enclosure 412 when heated (e.g., heated using a laser). In another embodiment, the second enclosure 414 contains the material 408. In another embodiment, both the first and the second sealed cavities 412 and 414 contain the material 408 in two separate portions. In one embodiment, the material 408 is deposited on or integrated within or into the substrate 404. In another embodiment, an enclosure contains both an outgassing material and a gettering material deposited in different areas within the same enclosure.

In the device 400, the first and the second sealed cavities 412 and 414 are sealed at the same time and under the same process conditions. After sealing, the enclosure or cavity pressure can be selectively altered within each of the first and the second enclosures 412 and 414 by applying varying amounts of a laser light 404. In one embodiment, and as aforementioned, once the laser light 404 is applied to the material 408, the material 408 will heat up.

If the material 408 is an outgassing material then the heating up will result in outgassing (releasing of gases) into the first enclosure 412 thereby increasing the pressure within the first enclosure 412. If the material 408 is a gettering material then the heating up will result in absorption of gases from the first enclosure 412 thereby decreasing the pressure within the first enclosure 412.

In FIG. 4, the second enclosure does not include an outgassing or gettering material and therefore the laser light 406 is not applied through the cap 402 and into the second enclosure 414. As a result, only the pressure of the first enclosure 412 will increase (or decrease) and the pressure of the second enclosure 414 will be the same pressure as originally sealed. If the pressure of the first enclosure 412 is increased (because the material 408 is outgassing) then the pressure of the second enclosure 414 would be lower than the pressure of the first enclosure 412. If the pressure of the first enclosure 412 is decreased (because the material 408 is a getter material) then the pressure of the second enclosure 414 would be higher than the pressure of the first enclosure 412.

The main difference between the device 300 of FIG. 3 and the device 400 of FIG. 4 is the presence of a layer 310 coupled to the material 308 within the first enclosure 312 of FIG. 3 that is not present in FIG. 4 (the material 408 is stand-alone within the first enclosure 412). The layer 310 (and any type of metal layer) reflects the laser light and increases the heat that is applied onto the material that is within the first enclosure. In one embodiment, only an outgassing material is utilized as the material 308 in conjunction with the layer 310 of FIG. 3 and only a gettering material is utilized as the material 408 of FIG. 4.

In one embodiment, the getter (gettering) metal includes but is not limited to any of aluminum, magnesium, strontium, barium, calcium, zirconium, nickel, niobium, cesium, tantalum, titanium, thorium, cerium, lanthanum, cobalt, vanadium, and phosphorous. Once the heat is applied to the getter material, the getter material is activated which causes any of absorption, adsorption, and a chemical reaction with gases within the sealed cavities and thereby decreases the pressure within the sealed cavities.

Figure 5:
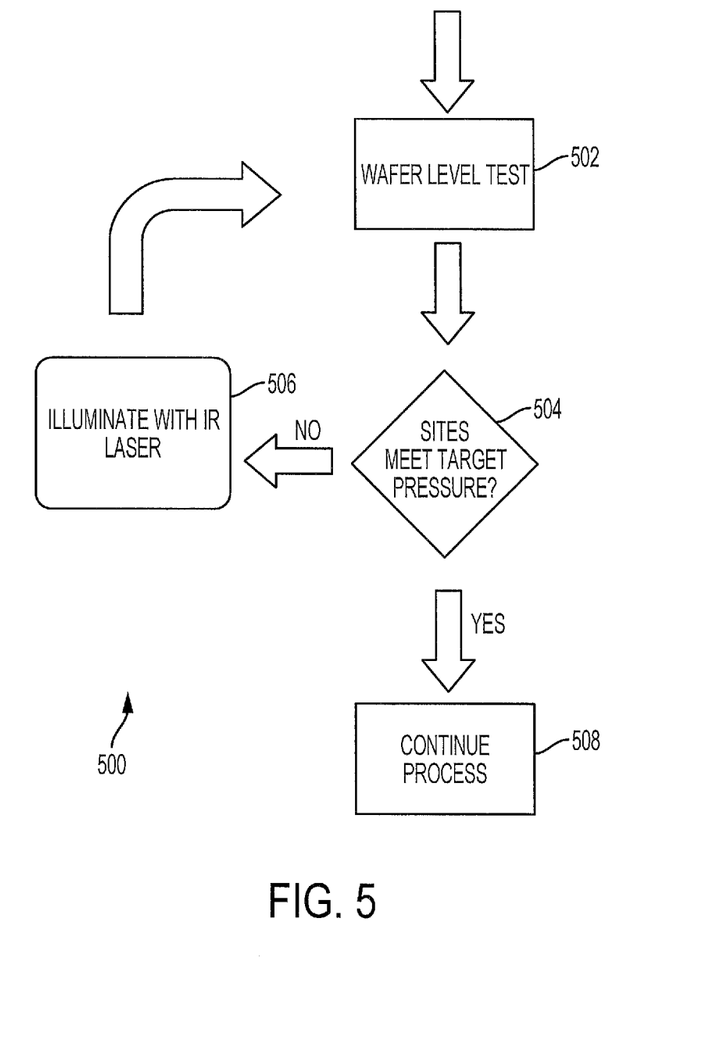
FIG. 5 illustrates a method for changing a pressure within a device in accordance with an embodiment.

FIG. 5 illustrates a method 500 for changing a pressure within a device in accordance with an embodiment. The method 500 comprises testing the device using a wafer level test, via step 502, and determining whether predetermined and preselected sites associated with the device meet a target or desired pressure, via step 504. If the sites do not meet the target pressure, then the sites are illuminated with a laser (e.g., IR laser), via step 506, to apply heat to a material within the device that when heated changes the pressure within the device. Therefore, the heating of the material using the laser enables the site or sites that do not meet the target pressure to be tuned to meet the target pressure. After step 506, the method 500 returns back to step 502 to perform additional testing and determine whether the sites now meet the target pressure. This feedback loop will continue until all of the sites within the device meet target pressures. Once all of the sites within the device meet the target pressures, the method 500 continues the manufacturing process associated with the device, via step 508.

The method 500 can be applied during the testing of electrical, optical, mechanical, or other properties within sealed cavities of MEMS devices and other devices. In the method 500, a wafer with at least one enclosure undergoes an initial wafer level test and if the pressure within the at least one enclosure does not meet the target pressure value, the pressure can be increased (or decreased) by applying a laser light (or other form of heat) to a material located within the at least one enclosure of the device. The device will be subsequently and repeatedly tested for pressure and performance and additional laser light or heat can be applied until the target pressure values are achieved within the at least one enclosure. The method 500 provides a closed loop feedback control to increase/decrease pressure to a desired level within each enclosure of a device.

Figure 6:
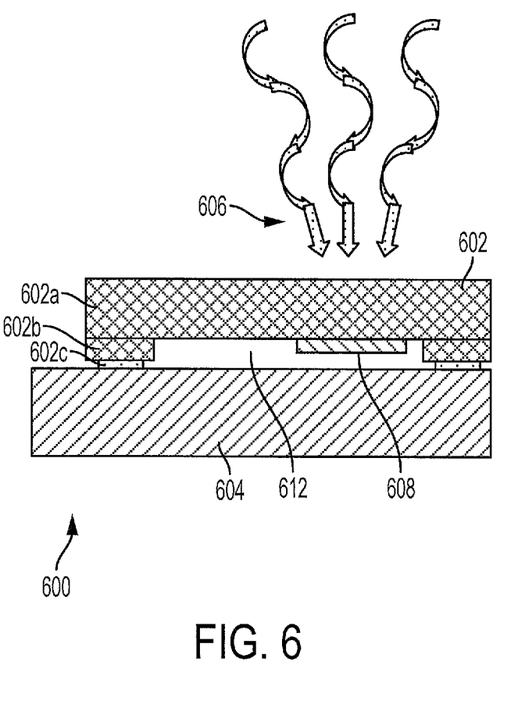
FIG. 6 illustrates a cross-section view of a device in accordance with an embodiment.

FIG. 6 illustrates a cross-section view of a device 600 in accordance with an embodiment. The device 600 includes a cap 602 and a substrate 604 bonded or coupled to the cap 602. In the device 600, an enclosure 612 is formed between the cap 602 and the substrate 604. In one embodiment, the enclosure 612 is formed with a desired gas and at a desired pressure by any of wafer fusion bonding, eutectic bonding, thermal compression bonding, epoxy, and other bonding methods. In one embodiment, the cap 602 (cap wafer) includes a MEMS device within the enclosure 612 and the substrate 604 is a complementary metal-oxide-semiconductor (CMOS) substrate (CMOS circuit wafer).

In one embodiment, the cap 602 comprises a handle wafer 602a, a MEMS device wafer 602b, and a seal ring 602c which interfaces with the substrate 604. In another embodiment, the cap 602 comprises a different set of parts. The enclosure 612 contains a material 608 which changes the pressure within the enclosure 612 when heated (e.g., heated using a laser). In one embodiment, the material 608 is deposited or grown on the cap 602. It may be advantageous to deposit an outgassing or getter material on the cap 602 if the material is not compatible with fabrication of the substrate 604, for example if the substrate 604 is a CMOS circuit wafer.

In one embodiment, the material 608 is an outgassing material that increases the pressure within the enclosure 612 when heated by the laser light 606. In another embodiment, the material 608 is a gettering material that decreases the pressure within the enclosure 612 when heated by the laser light 606. In another embodiment, both outgassing and getter materials are deposited on the cap 602 in different areas but within the same enclosure 612. The device 600 enables for the increase or reduction of pressure as desired to meet target pressure levels.

In the described embodiments, the laser can be applied either from the cap 102, 202, 302, 402 and 602 or from the substrate 104, 204, 304, and 604.

A method and system for changing a pressure in a device are disclosed. In one embodiment, the device is a MEMS device. The method comprises applying heat through one of at least two substrates onto a material of the device which changes the pressure within at least one enclosure when exposed to the heat, wherein the at least one enclosure is formed by the at least two substrates. In one embodiment, the method applies the heat by using a laser. In one embodiment, the laser is an infrared (IR) laser. In one embodiment, the material of the device comprises any of an outgassing material and a gettering material.

In one embodiment, the outgassing material comprises a silicon oxide compound. In one embodiment, the gettering material comprises any of titanium, a titanium compound, zirconium, a zirconium compound, aluminum, magnesium, strontium, barium, calcium, nickel, niobium, cesium, tantalum, thorium, cerium, lanthanum, cobalt, vanadium, and phosphorous. In one embodiment, the at least one enclosure includes a metal trough for holding the material there within. In one embodiment, the material comprises a plurality of interlayer dielectrics (ILDs) within the metal trough. In one embodiment, the device further includes a metal layer that has been integrated or coupled to one or both of the at least two substrates and the material is deposited onto the metal layer, wherein the metal layer prevents further transmission of the laser thereby preventing further heating of the material. The metal layer is a portion of the metal trough that prevents further transmission of the laser.

In one embodiment, the at least one enclosure of the device is formed by coupling or bonding together a MEMS substrate and a complementary metal-oxide-semiconductor (CMOS) substrate. In one embodiment, the material is disposed on any of the MEMS substrate and the CMOS substrate.

In one embodiment, the method comprises applying the laser in a repeated manner to change the pressure within the at least one enclosure. In one embodiment, the method further includes measuring a pressure within the at least one enclosure and reapplying the laser to the material to change the pressure within the at least one enclosure.

In another embodiment, the method further includes measuring a parameter indicative of the pressure within the at least one enclosure and reapplying the laser to the material to change the parameter. In one embodiment, the parameter is any of Q characteristics of the device, damping characteristics of the device, acoustic characteristics of the device, heat transfer within the at least one enclosure, and sound velocity of the device.

In one embodiment, the system is a device. In another embodiment, the system is a MEMS device. The device comprises a first substrate and a second substrate coupled or bonded to the first substrate, wherein at least one enclosure is formed by and located between the first and the second substrates. The device further comprises a metal layer within either one of first substrate and the second substrate. The device further comprises a material that is within the metal layer or vertically aligned over the metal layer. When the material is heated by a laser or another heating device, the material changes a pressure within the at least one enclosure. In one embodiment, the first substrate is the MEMS substrate and the second substrate is a CMOS substrate. In another embodiment, the first substrate is the CMOS substrate and the second substrate is the MEMS substrate.

As above described, a method and system (e.g., MEMS device) in accordance with the present invention enables dynamic changing of the pressure within cavities or enclosures of the MEMS device after the cavities have already been sealed. By integrating a material within the sealed cavities that are either made up of an outgassing material or a gettering material and by applying a laser or heat to the material, the pressure within the sealed cavities can be altered in accordance with product specifications and desired varied pressure levels between the cavities. If the material is outgassing, the pressure will be increased as the heating of the material will release gases into the enclosure. If the material is gettering, the pressure will be decreased as the heating of the material will absorb gases from the enclosure.

The method and system in accordance with the present invention greatly reduces the manufacturing process involved with creating a device (such as a MEMS device) that includes a plurality of cavities that are each at differing pressure levels. Instead of having to manufacture each cavity with a certain desired pressure level during the manufacturing process and before cavity sealing (which adds complexity, time, and cost), the plurality of cavities can be manufactured and sealed all at the same pressure level and then the laser (or other form of heat) can be applied selectively within each of the cavities to alter the pressure levels to the desired target values.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for changing a pressure within at least one enclosure in a microelectromechanical systems (MEMS) device, the method comprising:
    applying a laser through one of at least two substrates onto a material that changes the pressure within at least one enclosure when exposed to the laser, wherein the at least one enclosure is formed by a MEMS substrate and a complementary metal-oxide-semiconductor (CMOS) substrate of the at least two substrates, and wherein the material is disposed on a metal layer of at least one of the MEMS substrate or the CMOS substrate; and
    reflecting at least a portion of incident laser light from the laser with the metal layer back onto the material.

2. The method of claim 1, further comprising:
    embedding the material within one of the at least two substrates before applying the laser.

3. The method of claim 1, wherein one of the at least two substrates includes a cavity.

4. The method of claim 1, wherein the one of the at least two substrates is a silicon substrate.

5. The method of claim 1, wherein the at least one enclosure contains a MEMS structure.

6. The method of claim 1, wherein the material comprises an outgassing material.

7. The method of claim 6, wherein the outgassing material comprises silicon oxide compound.

8. The method of claim 1, wherein the material comprises a gettering material.

9. The method of claim 8, wherein the gettering material comprises any of titanium, titanium compound, zirconium, zirconium compound, aluminum, magnesium, strontium, barium, calcium, nickel, niobium, cesium, tantalum, thorium, cerium, lanthanum, cobalt, vanadium, and phosphorous.

10. The method of claim 1, wherein one of the at least two substrates includes a metal trough comprising the metal layer for holding the material there within.

11. The method of claim 10, further comprising:
coupling the metal layer to one of the at least two substrates, wherein the metal layer is a portion of the metal trough that prevents further transmission of the laser.

12. The method of claim 10, wherein the material comprises a plurality of interlayer dielectrics (ILDs) within the metal trough.

13. The method of claim 1, wherein the material is disposed on the MEMS substrate.

14. The method of claim 1, wherein the material is disposed on the CMOS substrate.

15. The method of claim 1, wherein the laser is applied in a repeated manner to change the pressure within the at least one enclosure.

16. The method of claim 1, further comprising:
measuring a pressure within the at least one enclosure; and
reapplying the laser to the material to change the pressure within the at least one enclosure.

17. The method of claim 1, further comprising:
measuring a parameter indicative of the pressure within the at least one enclosure; and
reapplying the laser to the material to change the parameter.

18. The method of claim 17, wherein the parameter is any of Q characteristics of the device, damping characteristics of the device, acoustic characteristics of the device, heat transfer within the at least one enclosure, and sound velocity of the device.

19. The method of claim 1, wherein the laser is an infrared (IR) laser.

* * * * *